United States Patent
Kim et al.

(10) Patent No.: US 10,637,033 B2
(45) Date of Patent: Apr. 28, 2020

(54) BATTERY PACK HAVING IMPROVED CELL LEAD FIXING STRUCTURE

(71) Applicant: LG Chem, Ltd., Seoul (KR)

(72) Inventors: Do-Hyeon Kim, Daejeon (KR);
Jun-Yeob Seong, Daejeon (KR);
Hwa-Joong Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 238 days.

(21) Appl. No.: 15/825,368

(22) Filed: Nov. 29, 2017

(65) Prior Publication Data

US 2018/0151863 A1 May 31, 2018

(30) Foreign Application Priority Data

Nov. 29, 2016 (KR) .................. 10-2016-0160636

(51) Int. Cl.
| | |
|---|---|
| *H01M 2/04* | (2006.01) |
| *H01M 2/20* | (2006.01) |
| *H01M 10/42* | (2006.01) |
| *H01M 2/10* | (2006.01) |
| *H01M 2/22* | (2006.01) |
| *H01M 2/02* | (2006.01) |
| *H05K 3/32* | (2006.01) |
| *H01M 10/0525* | (2010.01) |

(52) U.S. Cl.
CPC .......... *H01M 2/206* (2013.01); *H01M 2/024* (2013.01); *H01M 2/04* (2013.01); *H01M 2/1061* (2013.01); *H01M 2/1077* (2013.01); *H01M 2/22* (2013.01); *H01M 10/425* (2013.01); *H05K 3/325* (2013.01); *H01M 10/0525* (2013.01); *H01M 2220/20* (2013.01); *H05K 2201/10037* (2013.01); *H05K 2203/104* (2013.01); *Y02E 60/122* (2013.01)

(58) Field of Classification Search
None
See application file for complete search history.

(56) References Cited

U.S. PATENT DOCUMENTS

| | | |
|---|---|---|
| 8,361,646 B2 | 1/2013 | Ferber, Jr. |
| 8,691,407 B2 | 4/2014 | Hong |
| 9,583,748 B2 | 2/2017 | Choi et al. |
| 2017/0125774 A1 | 5/2017 | Choi et al. |

FOREIGN PATENT DOCUMENTS

| | | | |
|---|---|---|---|
| CN | 103956879 A | * | 7/2014 |
| JP | 2006-216471 A | | 8/2006 |
| JP | 2008-091233 A | | 4/2008 |
| KR | 10-1142622 B1 | | 5/2012 |
| KR | 10-1547395 B1 | | 8/2015 |
| KR | 10-2015-0113827 A | | 10/2015 |
| KR | 10-2015-0115250 A | | 10/2015 |
| KR | 10-1654101 B1 | | 9/2016 |

* cited by examiner

*Primary Examiner* — Tracy M Dove

(74) *Attorney, Agent, or Firm* — Morgan, Lewis & Bockius LLP

(57) ABSTRACT

Disclosed is a battery pack, which includes a plurality of stacked cells; a board assembly including interconnect circuit boards (ICBs) arranged corresponding to cell leads; an ICB cover detachably coupled to the board assembly; and a magnet installed at the ICB cover and coupled to the ICB by a magnetic force thereof with the cell lead being interposed therebetween, wherein the lead is closely fixed to the ICB by means of the magnetic force acting between the ICB and the magnet.

6 Claims, 6 Drawing Sheets

BATTERY PACK HAVING IMPROVED CELL LEAD FIXING STRUCTURE

TECHNICAL FIELD

The present application claims priority to Korean Patent Application No. 10-2016-0160636 filed on Nov. 29, 2016 in the Republic of Korea, the disclosures of which are incorporated herein by reference.

The present disclosure relates to a battery pack, and more particularly, to a battery pack having an improved structure for fixing a cell lead to an interconnect circuit board (ICB).

BACKGROUND ART

A battery pack is formed by aggregating a plurality of cells by serial connections and/or parallel connections. The battery pack is usually fabricated with a pack structure including a cell assembly in which a plurality of cells are stacked in one direction, a plurality of ICBs electrically connected to cell leads respectively drawn from the cells, and a housing for accommodating the cell assembly.

The battery pack may have an increased output current by increasing the number of cells connected in parallel and may have an increased output voltage by increasing the number of cells connected in series. The battery pack is widely used in fields demanding a large output, such as vehicles, bicycles, electric tools and the like.

As the battery pack including a plurality of cells, as disclosed in Patent Literature 1, there is proposed a product in which both ends of a battery are supported by an end plate, a lead plate is disposed at a predetermined position of the end plate, and the lead plate is spot-welded to an end electrode of the battery.

Meanwhile, recently, a battery pack assembling technique for electrically connecting cell leads by welding to an ICB is being actively studied.

However, the assembling technique using the welding method as described above has a disadvantage in that it takes a long time to assemble the product due to the welding process. In addition, if a failure occurs after the welding process, the assembled battery modules should be wasted entirely, which causes a large loss.

In addition, the quality of the battery pack is determined depending on the quality of the welding. Also, since the welding process requires welding equipment, there are many restrictions on the working place for assembling the battery pack, and it is impossible to perform the assembly operation except for a designated place.

RELATED LITERATURES

Patent Literature

Patent Literature 1: Japanese Unexamined Patent Publication No. 2006-216471

DISCLOSURE

Technical Problem

The present disclosure is designed to solve the problems of the related art, and therefore the present disclosure is directed to providing a battery pack, which may exclude the welding process by closely fixing a cell lead to an ICB by using a magnet.

Technical Solution

In one aspect of the present disclosure, there is provided a battery pack, comprising: a plurality of stacked cells; a board assembly including interconnect circuit boards (ICBs) arranged corresponding to cell leads; an ICB cover detachably coupled to the board assembly; and a magnet installed at the ICB cover and coupled to the ICB by a magnetic force thereof with the cell lead being interposed therebetween, wherein the lead is closely fixed to the ICB by means of the magnetic force acting between the ICB and the magnet.

A bus bar may be located on the ICB to come into contact with the lead, and the bus bar may be made of metal which is capable of being adhered to the magnet.

The bus bar may be made of nickel, nickel alloy or iron.

The magnet may be provided in plural, corresponding to the cell leads, respectively, and a plurality of ribs may be provided at an inner side of the ICB cover to accommodate the magnets to be isolated from each other.

The magnets may be coupled to the ICB at a location within a projecting height of the ribs.

The ICB cover may be detachably coupled to the board assembly by means of a hook structure.

The board assembly may be provided to at least one end of the battery pack.

Advantageous Effects

According to the present disclosure, the assembly process may be simplified since it is possible to exclude the welding process by closely fixing a cell lead to an ICB by using a magnet.

Thus, if the present disclosure is applied, welding equipment is not required, and thus it is possible to manufacture a battery pack without any restriction on the working place.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
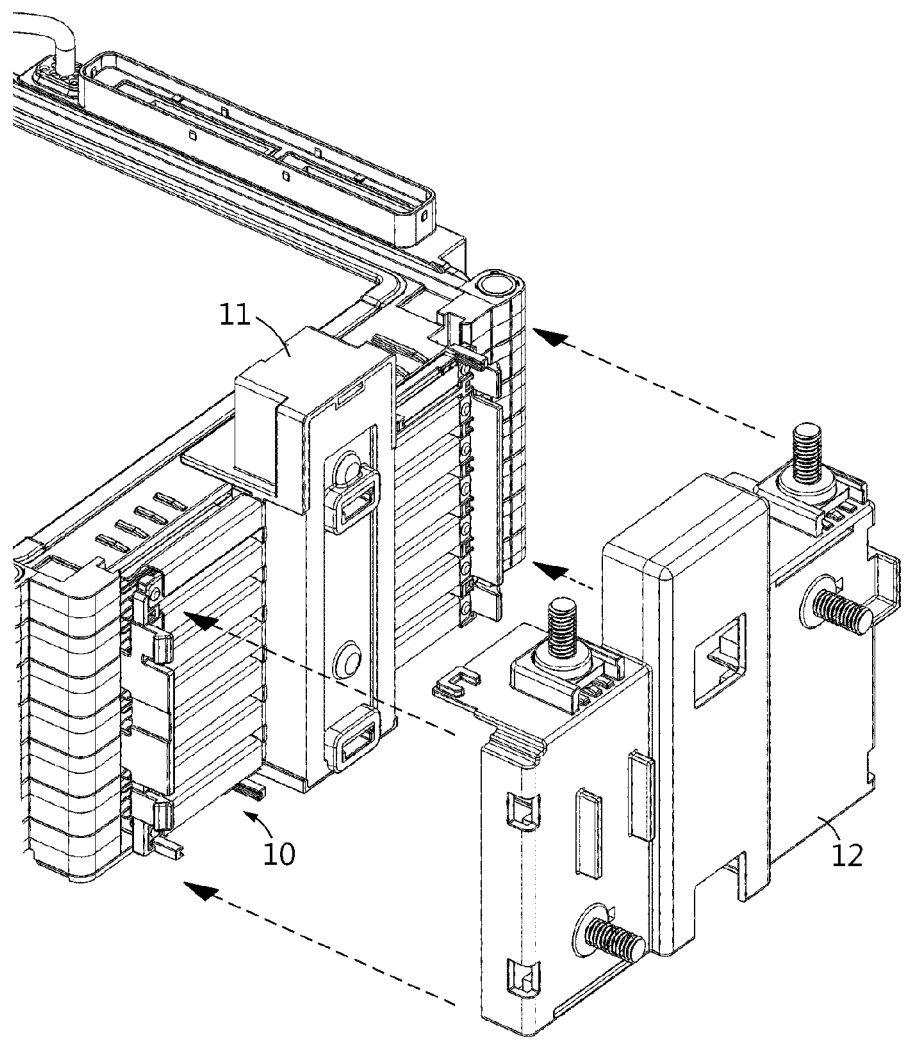
FIG. 1 is a perspective view showing essential parts of a battery pack according to an embodiment of the present disclosure.
Figure 2:
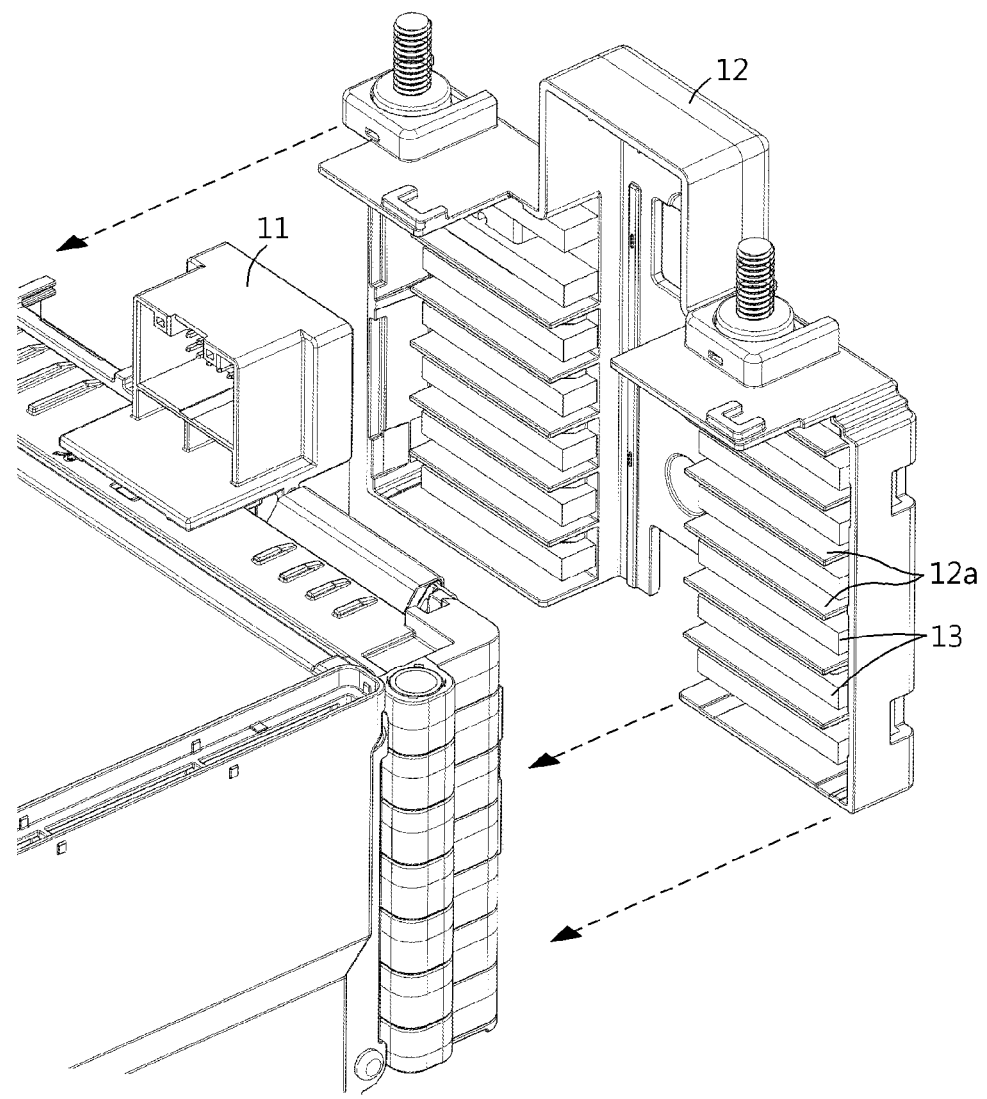
FIG. 2 is a perspective view showing an inner side of an ICB cover of FIG. 1.

FIG. 1 is a perspective view showing essential parts of a battery pack according to an embodiment of the present disclosure, and FIG. 2 is a perspective view showing an inner side of an ICB cover of FIG. 1.

Referring to FIGS. 1 and 2, a battery pack according to an embodiment of the present disclosure includes a cell assembly 10 having a plurality of stacked cells, a board assembly 11 in which ICBs 11a (see FIG. 4) are arranged, and an ICB cover 12 coupled to the board assembly 11 and having a magnet 13 disposed corresponding to each ICB 11a.

Each cell of the cell assembly 10 has a thin plate-like body and may have a pouch cell structure. The pouch cell includes a positive electrode, a separator and a negative electrode alternately, which are stacked alternately, and an electrode tab is drawn out to at least one side. The positive electrode and the negative electrode are prepared by applying slurry containing an electrode active material, a binder resin, a conductive agent and other additives to at least one side of a current collector. In the case of the positive electrode, a common positive electrode active material such as a lithium-containing transition metal oxide is used as the electrode active material. In the case of the negative electrode, a common negative electrode active material such as a lithium metal, a carbon material, a metal compound, or mixtures thereof, which are capable of intercalating and de-intercalating lithium ions, may be used as the electrode active material. In addition, the separator may adopt a common porous polymer film used in a lithium secondary battery.

An electrolyte accommodated in the pouch case together with the electrode assembly may adopt a common electrolyte for a lithium secondary battery. The pouch case is made of a sheet material and has an accommodation portion for accommodating the electrode assembly. The pouch case may be formed by combining a first case and a second case formed by processing a sheet material into a predetermined shape. The sheet material of the pouch case has a multi-layered structure in which an outer resin layer provided at an outermost side and made of an insulating material such as polyethylene terephthalate (PET) or nylon, a metal layer made of an aluminum material to maintain mechanical strength and prevent penetration of moisture and oxygen, and an inner resin layer made of a polyolefin-based material and having thermal adhesiveness to serve as a sealing material are stacked.

In the sheet material of the pouch case, if necessary, a predetermined adhesive resin layer may be interposed between the inner resin layer and the metal layer and between the outer resin layer and the metal layer. The adhesive resin layer is used for smooth adhering between different kinds of materials and may be formed a single-layered or multi-layered structure. Also, the adhesive resin layer may be commonly made of a polyolefin resin, or a polyurethane resin for smooth processing, or a mixture thereof.

In the cell assembly 10, the plurality of cells are arranged in a cell thickness direction to form a substantially stacked structure, and a cell lead 14a or 14b provided at each cell is drawn to at least one end of the battery pack and connected to the board assembly 11.

In the board assembly 11, the ICBs 11a disposed corresponding to the cell leads are arranged at regular intervals. Each cell lead and each ICB 11a corresponding thereto are closely adhered and electrically connected to each other without welding. To this end, the ICB cover 12 having the magnet 13 is coupled to the board assembly 11.

The ICB cover 12 is detachably coupled to the board assembly 11 by a hook structure. The hook structure allows the ICB cover 12 to be fixed in place on the board assembly 11 and may be easily assembled and disassembled in a one-touch manner.

Figure 3:
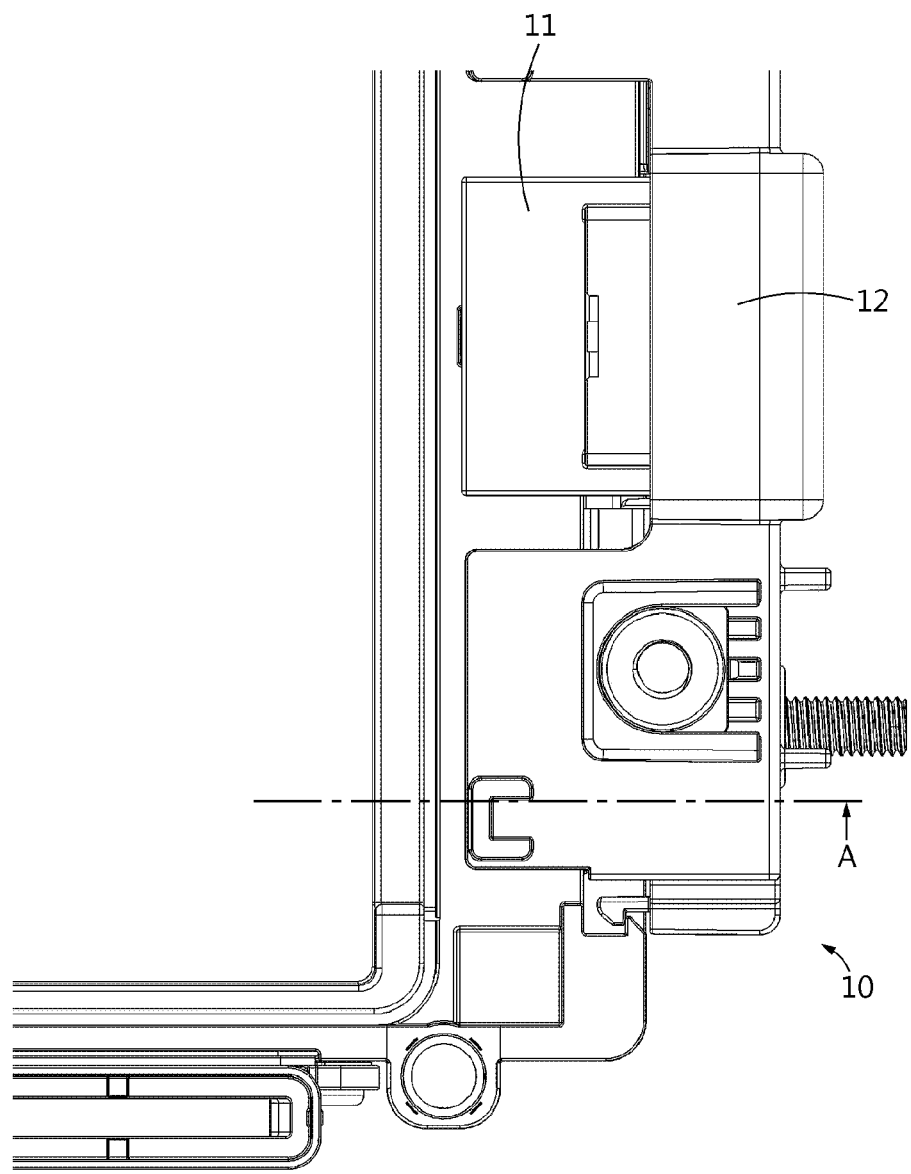
FIG. 3 is a plane view of FIG. 1 showing an assembled state.
Figure 4:
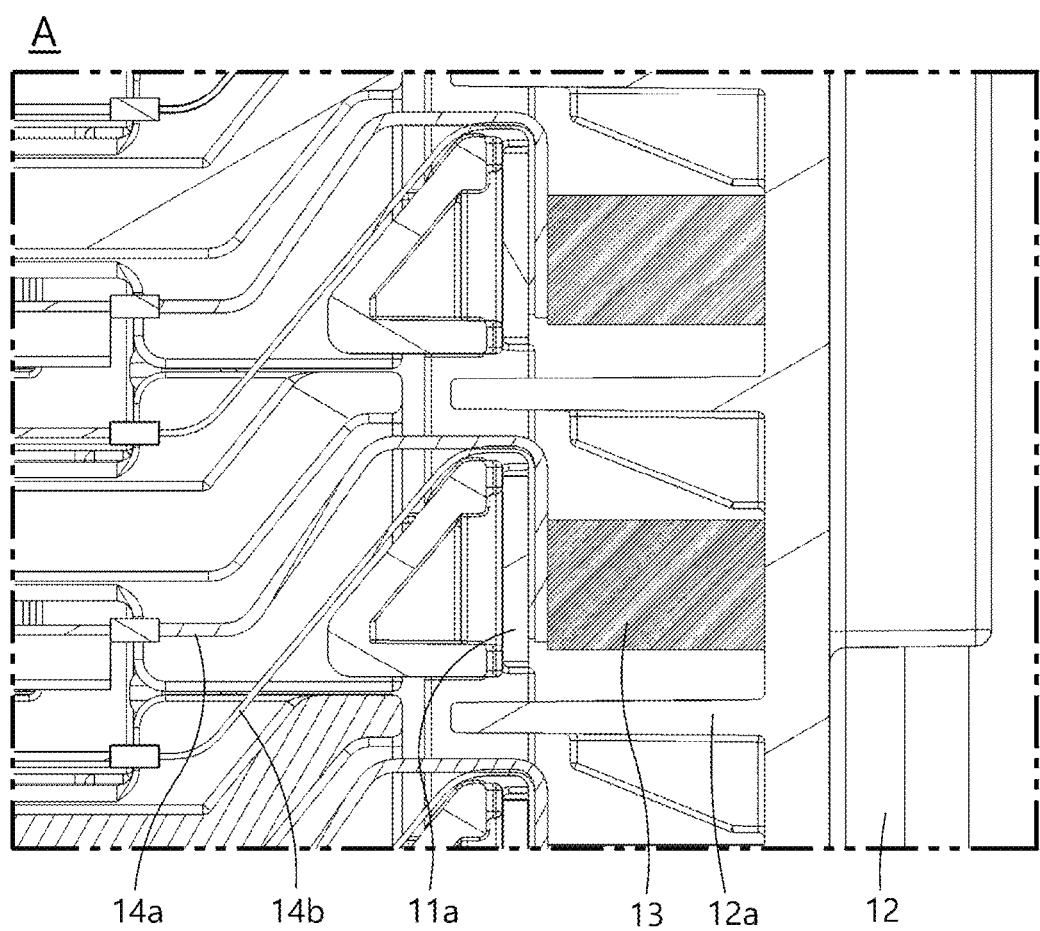
FIG. 4 is a cross-sectioned view of FIG. 3.

The magnets 13 are fixed to an inner surface of the ICB cover 12 at predetermined intervals. As shown in FIGS. 3 and 4, in a state where the ICB cover 12 is assembled, the magnet 13 is coupled to the ICB 11a corresponding thereto by means of its magnetic force with the cell lead being interposed therebetween. To this end, a bus bar having a predetermined shape and made of a material capable of being adhered to the magnet is fixedly disposed on the ICB 11a. Here, the bus bar may include a nickel (Ni), a nickel (Ni) alloy, or a nickel (Ni) layer, or be made of iron (Fe).

Due to the magnetic force acting between the ICB 11a and the magnet 13, the cell lead located therebetween is closely fixed and electrically connected to the ICB 11a.

In the ICB cover 12, a plurality of magnets 13 are arranged at predetermined intervals corresponding to the leads, respectively. In order to prevent the magnets 13 from being adhered to each other, a plurality of ribs 12a capable of isolating the magnets 13 from each other is provided at an inner surface of the ICB cover 12. In order to prevent short circuit between the cell leads, the point at which the ICB 11a and the magnet 13 are coupled may be located within a projecting height of the ribs 12a.

Figure 5:
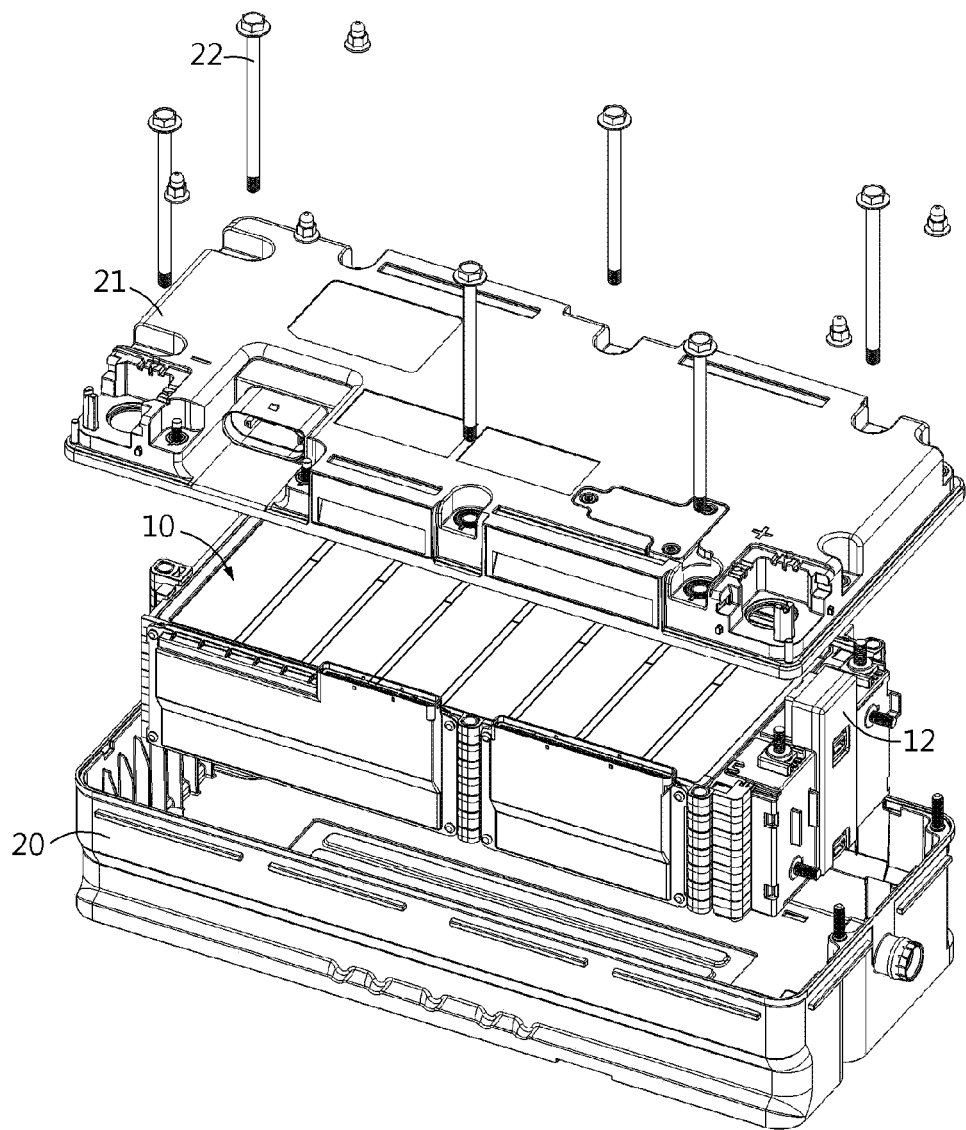
FIGS. 5 and 6 are perspective views showing a battery pack according to another embodiment of the present disclosure before and after being assembled.
Figure 6:
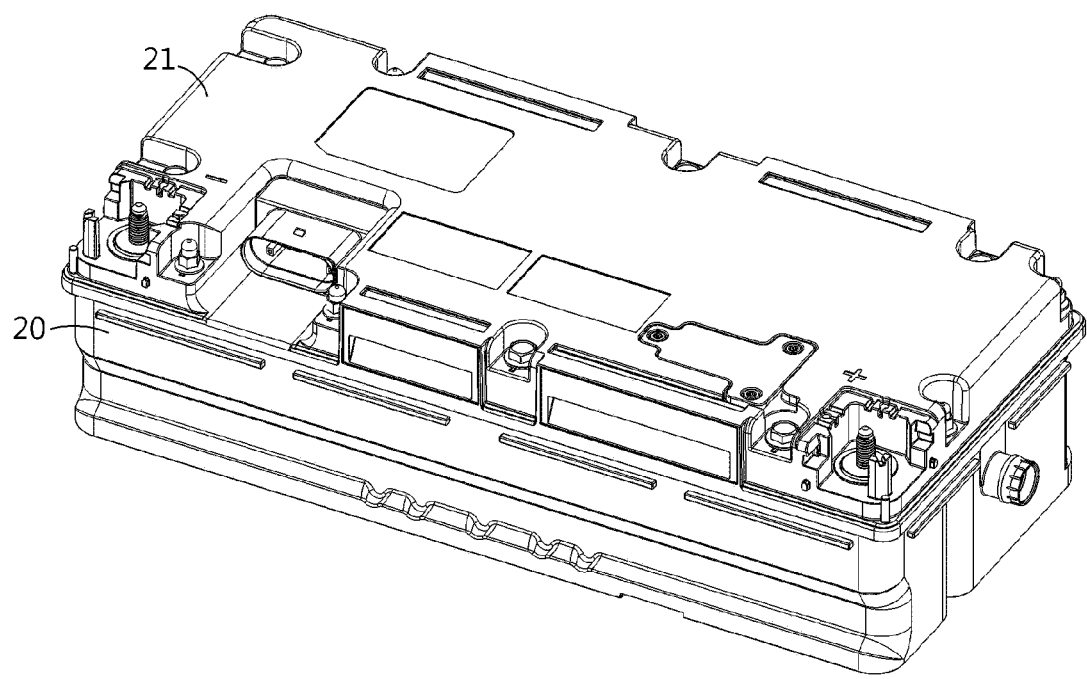

As shown in FIG. 5, the cell assembly 10 to which the ICB cover 12 is completely assembled is put into a pack housing 20, and is covered by a cover 21 and fastened with bolts 22, thereby fabricating a battery pack as shown in FIG. 6. At this time, in order to prevent the ICB cover 12 from moving, a rib structure having a predetermined shape may be provided at an inner wall of the housing 20.

If the ICB cover 12 is coupled to the board assembly 11, the battery pack configured as above may be closely fixed to the ICB 11a by the magnetic force acting between the magnet 13 and the ICB 11a, and thus it is possible to simplify the battery pack assembling work by excluding the welding process.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

| Reference Signs | |
| --- | --- |
| 10: cell assembly | 11: board assembly |
| 11a: ICB | 12: ICB cover |
| 12a: rib | 13: magnet |
| 20: housing | 21: cover |

What is claimed is:
1. A battery pack, comprising:
a plurality of stacked cells;
a board assembly including an interconnect circuit board (ICB) configured to electrically connect and fix to a cell lead;

an ICB cover detachably coupled to the board assembly; and a magnet installed at the ICB cover and coupled to the ICB by a magnetic force thereof, the cell lead being interposed between the ICB and the magnet, wherein the cell lead is closely fixed to the ICB by the magnetic force acting between the ICB and the magnet.

2. The battery pack according to claim 1, wherein a bus bar is located on the ICB to come into contact with the cell lead, and wherein the bus bar is made of a metal which is capable of being adhered to the magnet.

3. The battery pack according to claim 2, wherein the metal is nickel, nickel alloy or iron.

4. The battery pack according to claim 2, wherein the magnet is provided in plural, the cell lead is provided in plural, each cell lead of the plurality of cell leads is interposed between the ICB and a respective magnet of the plurality of magnets, and wherein a plurality of ribs are provided at an inner side of the ICB cover to isolate each of the plurality of magnets from each other.

5. The battery pack according to claim 4, wherein each of the plurality of magnets is coupled to the ICB at a location within a projecting height of the plurality of ribs.

6. The battery pack according to claim 1, wherein the board assembly is provided to at least one end of the battery pack.

\* \* \* \* \*